United States Patent
Zhou

(10) Patent No.: US 10,403,741 B2
(45) Date of Patent: Sep. 3, 2019

(54) CHANNEL STOP IMP FOR FINFET DEVICE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/925,390

(22) Filed: Mar. 19, 2018

(65) Prior Publication Data
US 2018/0337268 A1 Nov. 22, 2018

(30) Foreign Application Priority Data
May 19, 2017 (CN) .......................... 2017 1 0355416

(51) Int. Cl.
*H01L 21/00* (2006.01)
*H01L 29/66* (2006.01)
(Continued)

(52) U.S. Cl.
CPC .. *H01L 29/66803* (2013.01); *H01L 21/30625* (2013.01); *H01L 29/0638* (2013.01);
(Continued)

(58) Field of Classification Search
CPC .......... H01L 29/66545; H01L 29/66871; H01L 21/30625
See application file for complete search history.

(56) References Cited

U.S. PATENT DOCUMENTS 9,087,860 B1 * 7/2015 Banghart .......... H01L 29/66803
9,595,518 B1 * 3/2017 Chou .................. H01L 27/0629
(Continued)

*Primary Examiner* — Nicholas J Tobergte
(74) *Attorney, Agent, or Firm* — Kilpatrick Townsend & Stockton LLP

(57) ABSTRACT

A method of manufacturing a semiconductor device includes providing a semiconductor structure including a substrate, a semiconductor fin on the substrate, and a dummy gate structure on the semiconductor fin. The dummy gate structure includes a dummy gate dielectric layer on the semiconductor fin and a dummy gate on the dummy gate dielectric layer. The method also includes forming an interlayer dielectric layer on the semiconductor substrate, planarizing the interlayer dielectric layer to expose an upper surface of the dummy gate, and performing a first doping implant into the semiconductor fin through the dummy gate to form an anti-puncture region in the semiconductor fin. The anti-puncture region has an upper surface lower than an upper surface of a trench isolation portion surrounding the semiconductor fin to prevent a punch through of a source and drain, reducing a current leakage and parasitic capacitance of the semiconductor device.

18 Claims, 12 Drawing Sheets

(51) Int. Cl.
*H01L 29/06* (2006.01)
*H01L 29/78* (2006.01)
*H01L 21/306* (2006.01)
*H01L 29/10* (2006.01)

(52) U.S. Cl.
CPC .... *H01L 29/1083* (2013.01); *H01L 29/66545* (2013.01); *H01L 29/785* (2013.01); *H01L 29/66871* (2013.01)

(56) References Cited

U.S. PATENT DOCUMENTS

| | | | |
|---|---|---|---|
| 9,947,764 B2 * | 4/2018 | Liu | H01L 29/66545 |
| 2010/0176424 A1 * | 7/2010 | Yeo | H01L 21/26586 257/255 |
| 2015/0228766 A1 * | 8/2015 | Nieh | H01L 29/66803 438/283 |
| 2016/0365428 A1 * | 12/2016 | Liu | H01L 29/66545 |
| 2018/0233582 A1 * | 8/2018 | Liu | H01L 29/66545 |

* cited by examiner

CHANNEL STOP IMP FOR FINFET DEVICE

CROSS-REFERENCES TO RELATED APPLICATIONS

The present application claims priority to Chinese patent application No. 201710355416.9, filed with the State Intellectual Property Office of People's Republic of China on May 19, 2017, the content of which is incorporated herein by reference in its entirety.

FIELD OF THE INVENTION

The present application relates to semiconductor technology, and more particularly to a semiconductor device and method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have better control capability of gates than planar MOSFET devices to effectively suppress the short channel effect to facilitate a further size reduction of complementary metal oxide semiconductor (CMOS) devices.

Currently, in order to prevent punch-through between a source and a drain of a FinFET device, an anti-punch through implantation process needs to be performed to form an anti-punch through region below the source and the drain. However, a conventional anti-punch through implantation under the source region and the drain region may increase current leakage and parasitic capacitance, thereby reducing the device performance.

BRIEF SUMMARY OF THE INVENTION

The present inventor has discovered the above-described problems of conventional anti-punch through implantation processes and provides a novel technical solution for solving at least one of the above-described problems.

In one aspect of the present disclosure, a method for manufacturing a semiconductor device is provided. The method may include providing a semiconductor structure including a substrate, a semiconductor fin on the substrate, and a dummy gate structure on the semiconductor fin. The dummy gate structure includes a dummy gate dielectric layer on the semiconductor fin and a dummy gate on the dummy gate dielectric layer. The method may also include forming an interlayer dielectric layer on the semiconductor substrate, planarizing the interlayer dielectric layer to expose an upper surface of the dummy gate, and performing a first doping implant into the semiconductor fin through the dummy gate to form an anti-puncture region in the semiconductor fin.

In one embodiment, the first doping implant is an ion implantation.

In one embodiment, the semiconductor fin has a P-type conductivity, and the ion implantation is performed with a P-type dopant, at an energy in a range between 20 keV and 70 keV, and a dose in a range between $1.0 \times 10^{13}$ atoms/cm$^2$ and $5.0 \times 10^{14}$ atoms/cm$^2$.

In one embodiment, the semiconductor fin has an N-type conductivity, and the ion implantation is performed with an N-type dopant, at an energy in a range between 130 keV and 250 keV, and a dose in a range between $1.0 \times 10^{13}$ atoms/cm$^2$ and $3.0 \times 10^{14}$ atoms/cm$^2$.

In one embodiment, the method may further include, prior to performing the first doping implant, thinning the dummy gate using an etching process. In one embodiment, the semiconductor fin has a P-type conductivity, and the ion implantation is performed with a P-type dopant, at an energy in a range between 16 keV and 50 keV, and a dose in a range between $1.0 \times 10^{13}$ atoms/cm$^2$ and $3.0 \times 10^{14}$ atoms/cm$^2$. In one embodiment, the semiconductor fin has an N-type conductivity, and the ion implantation is performed with an N-type dopant, at an energy in a range between 110 keV and 200 keV, and a dose in a range between $1.0 \times 10^{13}$ atoms/cm$^2$ and $3.0 \times 10^{14}$ atoms/cm$^2$.

In one embodiment, the method may further include, after performing the first doping implant, performing an annealing treatment on the semiconductor structure. In one embodiment, the annealing treatment may include a spike annealing process or a laser annealing process.

In one embodiment, the spike annealing process is performed at a temperature in a range between 850° C. and 1000° C. The laser annealing process is performed at a temperature in a range between 1000° C. and 1200° C.

In one embodiment, the method may further include, prior to forming the interlayer dielectric layer, forming a source and a drain at least partially in the semiconductor fin and on opposite sides of the dummy gate structure. The anti-puncture region is formed between the source and the drain and spaced apart from the source and the drain.

In one embodiment, the method may further include, prior to forming the interlayer dielectric layer, performing a second doping implant into the source and the drain to increase a doping concentration of the source and the drain.

In one embodiment, the semiconductor structure may further include a trench isolation portion surrounding the semiconductor fin. The anti-puncture region has an upper surface lower than an upper surface of the trench isolation portion that surrounds the semiconductor fin to prevent a punch through of a source and a drain. The semiconductor structure can reduce a current leakage and parasitic capacitance of the semiconductor device and improve its performance.

In one embodiment, a vertical distance between the upper surface of the anti-puncture region and the upper surface of the trench isolation portion is in a range between 100 angstroms and 300 angstroms.

In one embodiment, the dummy gate structure further includes a dummy gate hardmask layer on the dummy gate; and planarizing the interlayer dielectric layer includes removing at least a portion of the interlayer dielectric layer and at least a portion of the dummy gate hardmask layer.

In one embodiment, the method may further include removing the dummy gate and the dummy gate dielectric layer to expose a portion of the semiconductor fin, and forming a gate structure on the exposed portion of the semiconductor fin. In one embodiment, forming the gate structure includes forming a gate dielectric layer on the semiconductor fin, and forming a gate on the gate dielectric layer.

Embodiments of the present disclosure also provide a semiconductor device. The semiconductor device includes a substrate, a semiconductor fin having an anti-puncture region on the substrate, a gate structure on the semiconductor fin, an interlayer dielectric layer on the substrate and surrounding the gate structure, and a source and a drain at least partially in the semiconductor fin and on opposite sides of the gate structure. The anti-puncture region is disposed between the source and the drain, spaced apart from the source and the drain, and below the gate structure.

In one embodiment, the semiconductor device further includes a trench isolation portion on the substrate and surrounding the semiconductor fin; wherein the anti-puncture region has an upper surface lower than an upper surface of the trench isolation portion.

In one embodiment, a vertical distance between the upper surface of the anti-puncture region and the upper surface of the trench isolation portion is in a range between 100 angstroms and 300 angstroms.

In one embodiment, the gate structure includes a gate dielectric layer on the semiconductor fin, and a gate on the gate dielectric layer.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1A:
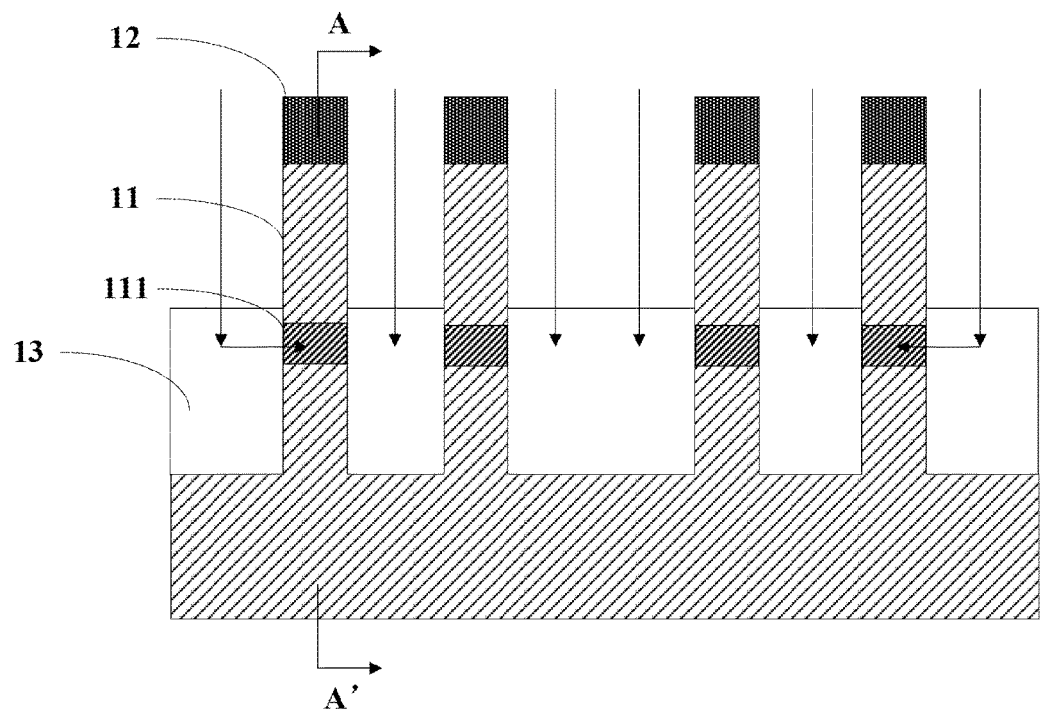
FIG. 1A is a cross-sectional view illustrating an intermediate stage of a semiconductor device, as known in the prior art.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIGS. 1A-1E are a cross-sectional views illustrating intermediate stages of a conventional method of manufacturing a semiconductor device, as known in the prior art.

Figure 1B:
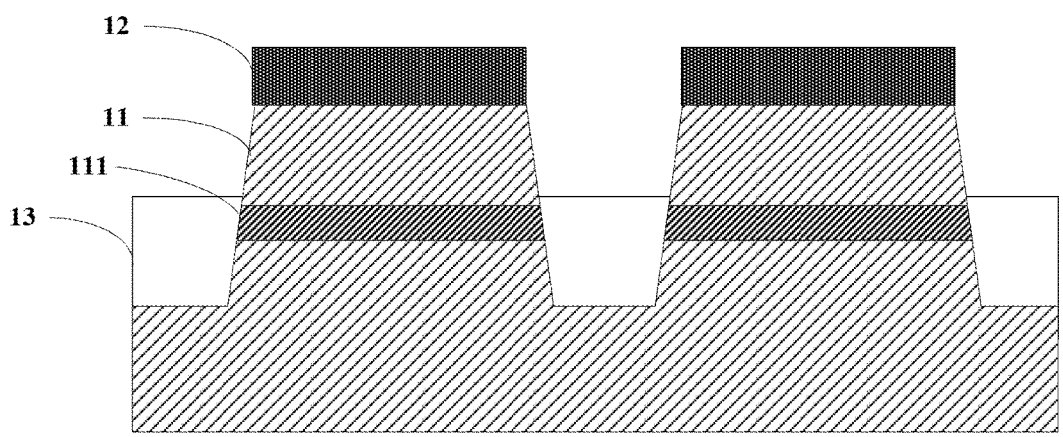
FIG. 1B is a cross-sectional view illustrating a structure shown in FIG. 1A taken along the line A-A'.

Referring to FIGS. 1A and 1B, a semiconductor structure is provided. The semiconductor structure includes semiconductor fins 11, a hardmask layer 12 on the semiconductor fins 11, and a shallow trench isolation (STI) 13 surrounding semiconductor fins 11. An ion implantation is performed on STI 13, where ions are laterally implanted into semiconductor fins 11, resulting in an anti-punch through implantation (also referred to as a channel stop implantation) to form an anti-puncture region 111.

Figure 1C:
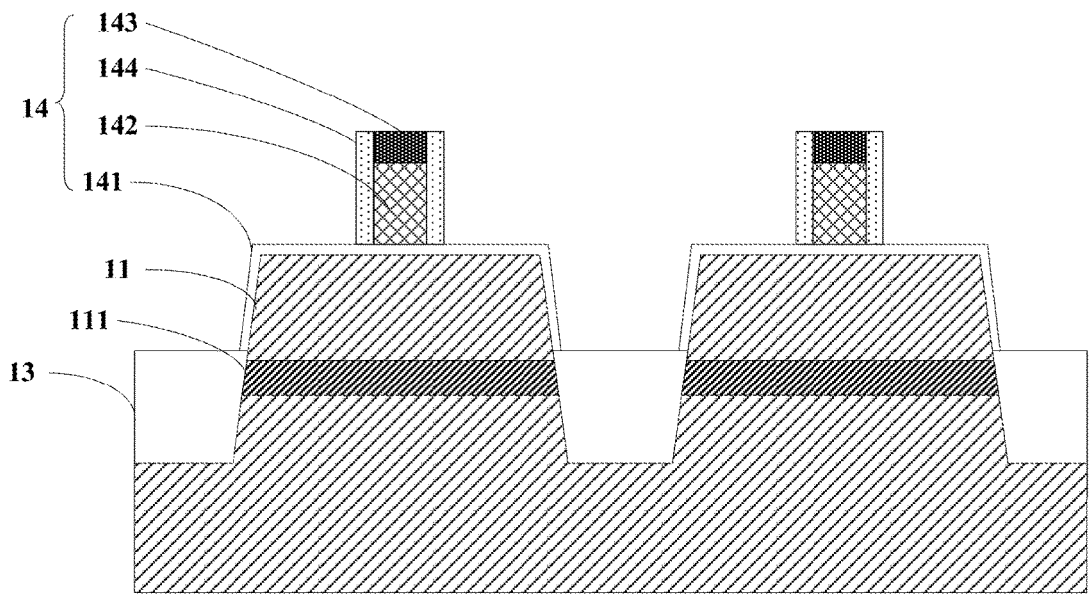
FIG. 1C is a cross-sectional view illustrating a semiconductor device structure after forming a dummy gate structure in the prior art.

Next, referring to FIG. 1C, a dummy gate structure 14 is formed on the semiconductor fins. Dummy gate structure 14 includes a dummy gate dielectric layer 141 on semiconductor fins 11, a dummy gate 142 on dummy gate dielectric layer 141, a hardmask layer 143 on dummy gate 142, and a spacer 144 on sidewalls of dummy gate 142.

Figure 1D:
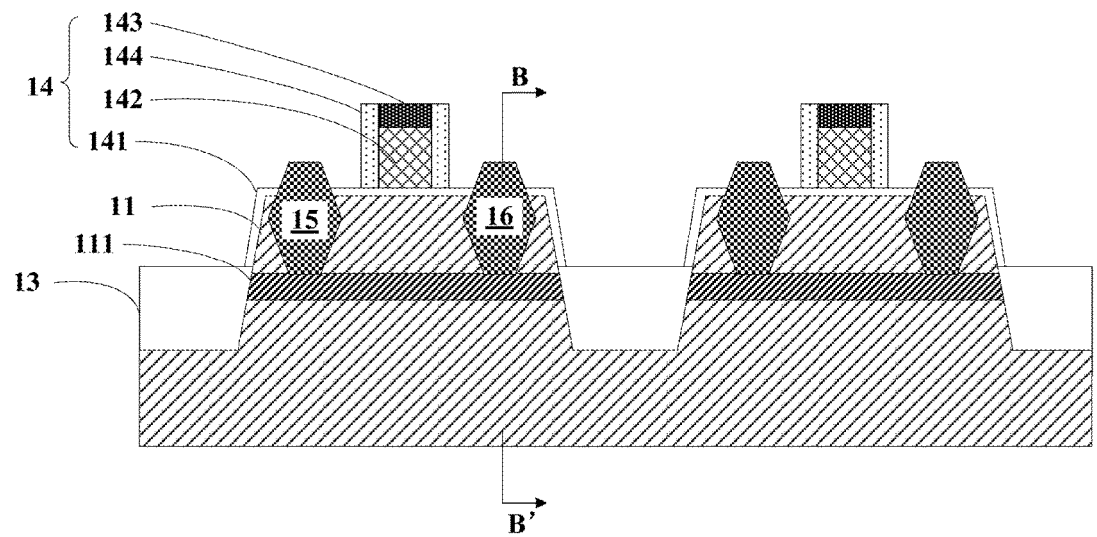
FIG. 1D is a cross-sectional view illustrating a semiconductor device structure after forming a source and drain in the prior art.
Figure 1E:
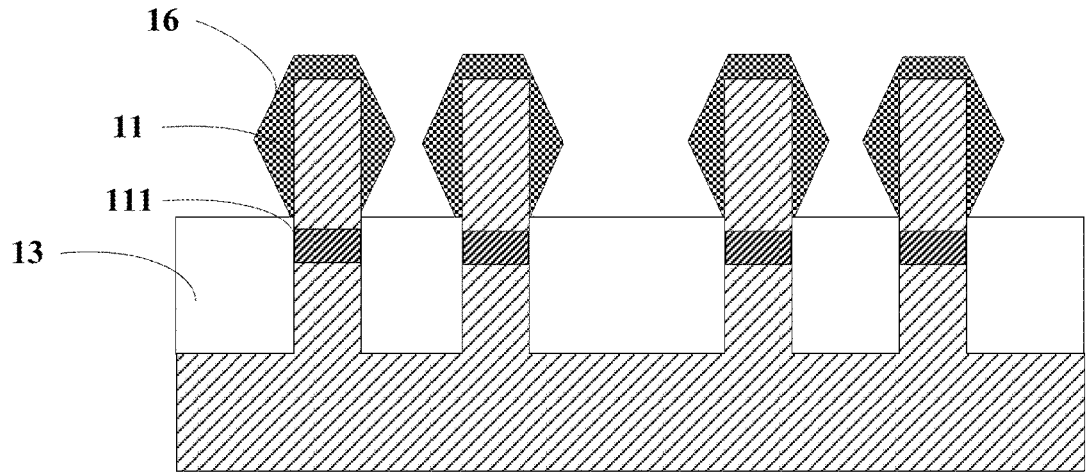
FIG. 1E is a cross-sectional view illustrating a structure shown in FIG. 1D taken along the line B-B'.

Next, referring to FIGS. 1D and 1E, a source 15 and a drain 16 are formed at least partially in the semiconductor fins by an etching and epitaxially grown process. Anti-puncture region 111 is formed below source 15 and drain 16.

The present inventor has discovered that, in the above-described manufacturing process, the anti-puncturing region is formed under source 15 and drain 16, and can come easily into contact (especially in the case of heavy doping) with the source and the drain (e.g., adjacent to the source and drain to form a pn junction), as shown in FIGS. 1D and 1E. This will increase the leakage current and parasitic capacitance (especially in a high threshold voltage device) and reduce the device performance.

Figure 2:
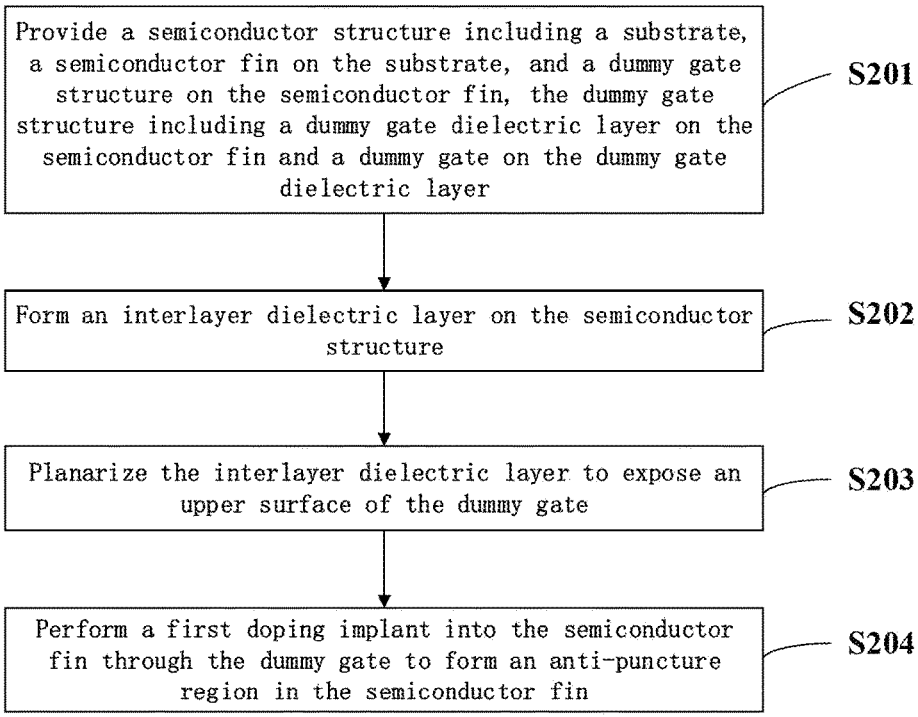
FIG. 2 is a flowchart of a method for manufacturing a semiconductor device according to an embodiment of the present disclosure.

FIG. 2 is a flowchart of a method of manufacturing a semiconductor device according to an embodiment of the present disclosure. Referring to FIG. 2, the method may include:

Step 201: providing a substrate structure including a substrate, a semiconductor fin on the substrate, and a dummy gate structure. The dummy gate structure includes a dummy gate dielectric layer and a dummy gate on the dummy gate dielectric layer.

Step 202: forming an interlayer dielectric layer on the semiconductor structure.

Step 203: planarizing the interlayer dielectric layer to expose an upper surface of the dummy gate.

Step 204: performing a first doping implant into the semiconductor fin through the dummy gate to form an anti-puncture region in the semiconductor fin.

The above-described embodiment provides a method of manufacturing a semiconductor device. In the manufacturing method, a first doping implant is performed into the semiconductor fin through the dummy gate to form an anti-puncture region in the semiconductor fin, so that the anti-puncture region is formed below the dummy gate, and as far as possible not below the source region or the drain region (in the case where the source region and drain region are present), so as not to be in contact with the source region and the drain region, thus the leakage current and parasitic capacitance are reduced, thereby improving the device performance.

In one embodiment, prior to forming the interlayer dielectric layer, the method may also include forming a source and a drain at least partially in the semiconductor fin and on opposite sides of the dummy gate structure. In the process of forming the anti-puncture region, the anti-puncture region is formed between the source and the drain and is spaced apart from the source and the drain. In the embodiment, the anti-puncture region is formed between the source and the drain and is spaced apart from the source and the drain, so as not to be in contact with the source and the drain, thereby preventing contact between the anti-puncture region and the source or the drain, thus the leakage current and parasitic capacitance are reduced, thereby improving the device performance.

In some embodiments of the present disclosure, the first doping implant is an ion implantation.

In one embodiment, the semiconductor fin may have P-type conductivity, i.e., an N-channel metal oxide semiconductor (NMOS) device may be formed on the semiconductor fin. The dopant of the ion implantation process is a P-type dopant, e.g., boron (B) or boron fluoride ($BF_2$). The ion implantation process is performed at an implant energy in the range between 20 keV and 70 keV (e.g., 40 keV, 60 keV), and a dose in the range between $1.0 \times 10^{13}$ atoms/$cm^2$ and $5.0 \times 10^{14}$ atoms/$cm^2$ (e.g., $5.0 \times 10^{13}$ atoms/$cm^2$ or $1.0 \times 10^{14}$ atoms/$cm^2$).

In another embodiment, the semiconductor fin may have N-type conductivity, i.e., a P-channel metal oxide semiconductor (PMOS) device may be formed on the semiconductor fin. The dopant of the ion implantation process is an N-type dopant, e.g., arsenic (As) or phosphorous (P). The ion implantation process is performed at an energy in the range between 130 keV and 250 keV (e.g., 200 keV, 230 keV), and a dose in the range between $1.0 \times 10^{13}$ atoms/$cm^2$ and $3.0 \times 10^{14}$ atoms/$cm^2$ (e.g., $5.0 \times 10^{13}$ atoms/$cm^2$ or $2.0 \times 10^{14}$ atoms/$cm^2$).

In some embodiments of the present disclosure, prior to performing the first doping implant, the method may also include performing a thinning process on the dummy gate by etching. Through the thinning process, the subsequent doping energy of the doping implant can be reduced to facilitate the implementation of the doping process.

In one embodiment, the semiconductor fin may have P-type conductivity. After performing the thinning process on the dummy gate, the dopant of the ion implantation process is a P-type dopant (e.g., B or $BF_2$). The ion implantation process can be performed at an energy in the range between 16 keV and 50 keV (e.g., 20 keV or 30 keV), and a dose in the range between $1.0 \times 10^{13}$ atoms/$cm^2$ and $5.0 \times 10^{14}$ atoms/$cm^2$ (e.g., $5.0 \times 10^{13}$ atoms/$cm^2$ or $1.0 \times 10^{14}$ atoms/$cm^2$).

In another embodiment, the semiconductor fin may have N-type conductivity. After performing the thinning process on the dummy gate, the dopant of the ion implantation process is an N-type dopant (e.g., As or P). The ion implantation process is performed at an energy in the range between 110 keV and 200 keV (e.g., 130 keV or 160 keV), and a dose in the range between $1.0 \times 10^{13}$ atoms/$cm^2$ and $3.0 \times 10^{14}$ atoms/$cm^2$ (e.g., $5.0 \times 10^{13}$ atoms/$cm^2$ or $2.0 \times 10^{14}$ atoms/$cm^2$).

FIG. 3 to FIG. 5, FIG. 6A to FIG. 6B, FIG. 7 to FIG. 9, FIG. 10A to FIG. 10B, FIG. 11A to FIG. 11B, FIG. 12 to FIG. 15, and FIG. 16A to FIG. 16B are cross-sectional views of intermediate stages of a method of manufacturing a semiconductor device according to one embodiment of the present disclosure. A manufacturing method of a semiconductor device according to an embodiment of the present disclosure will be described in detail with reference to these drawings.

First, a semiconductor structure is provided. The steps of providing the semiconductor structure are described with reference to FIGS. 3 to 5, FIGS. 6A to 6B, and FIG. 7.

Figure 3:
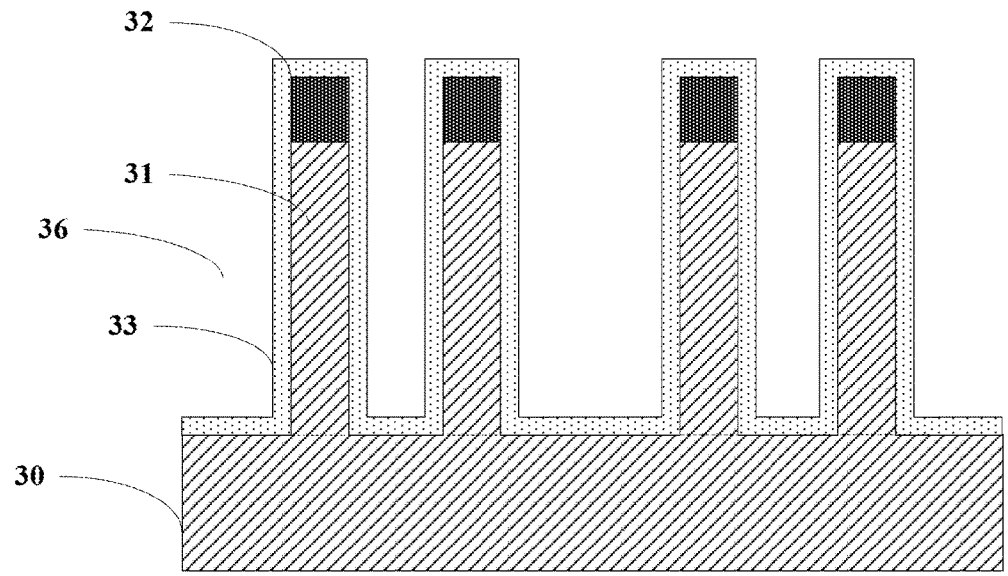
FIG. 3 is a cross-sectional view of an intermediate stage of a manufacturing method of a semiconductor device according to an embodiment of the present disclosure.

Referring to FIG. 3, an initial structure is provided. The initial structure includes a substrate (e.g., a silicon substrate) 30, a semiconductor fin 31 on substrate 30, and a fin hardmask layer (e.g., silicon nitride) 32 on the semiconductor fin. A trench 36 is formed around the semiconductor fin. In one embodiment, the initial structure may further include a buffer layer (not shown) between semiconductor fin 31 and fin hardmask layer 32. For example, the buffer layer may include silicon dioxide.

The steps of providing the initial structure may include providing a semiconductor substrate, forming a patterned fin hardmask layer on the semiconductor substrate. For example, a buffer layer may be first formed on the semiconductor substrate, the patterned fin hardmask layer is then formed on the buffer layer. Thereafter, the semiconductor substrate is then etched using the patterned fin hardmask layer as a mask to form the semiconductor fin.

It should be noted that the dotted line in FIG. 3 is provided for convenience of illustration and description only. However, the dotted line does not exist in actual devices. The same will apply to other drawings.

Referring to FIG. 3, a liner insulator layer (e.g., silicon dioxide) 33 is formed by deposition on the initial structure.

Figure 4:
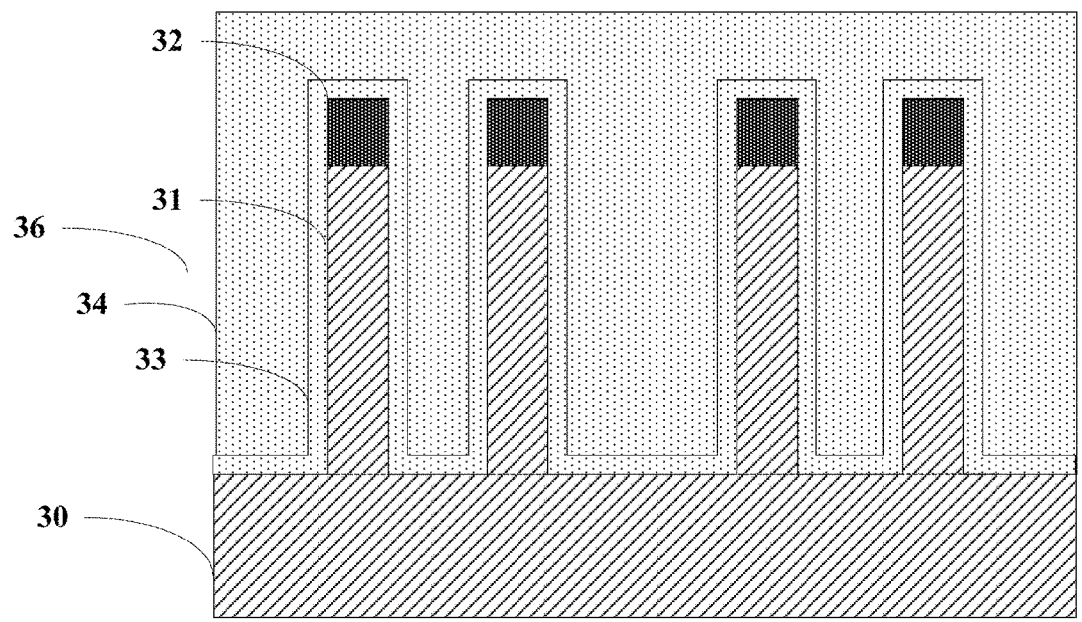
FIG. 4 is a cross-sectional view of an intermediate stage of a manufacturing method of a semiconductor device after forming a trench insulator layer according to an embodiment of the present disclosure.

Next, referring to FIG. 4, a trench insulator layer (e.g., silicon dioxide) 34 is formed by deposition (e.g., by a FCVD process) on the semiconductor structure shown in FIG. 3. In one embodiment, a planarization (e.g., chemical mechanical polishing) process is performed on trench isolation layer 34.

Figure 5:
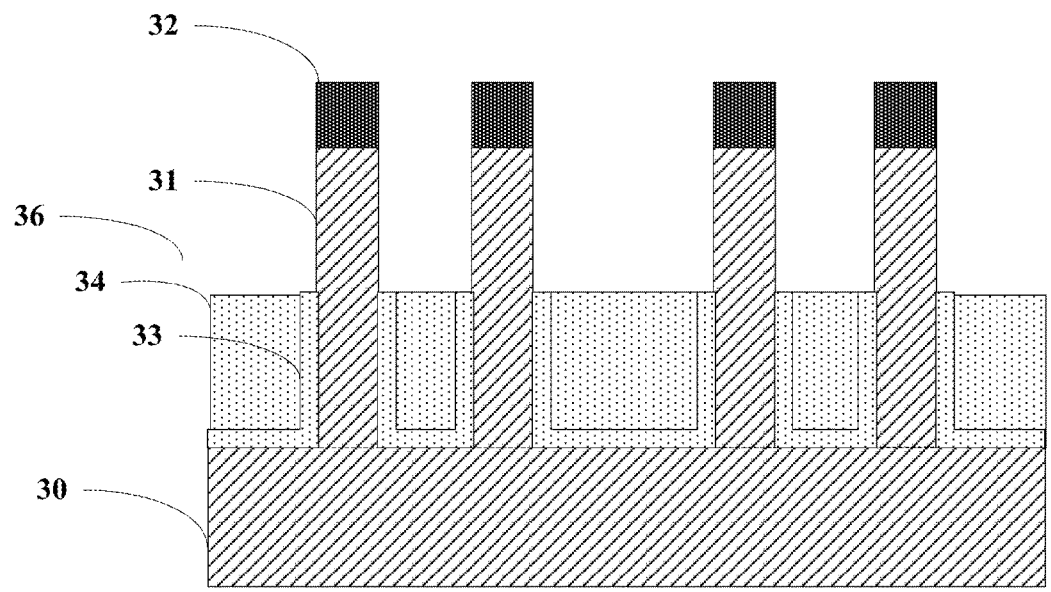
FIG. 5 is a cross-sectional view of an intermediate stage of a manufacturing method of a semiconductor device after removing a portion of the trench insulator layer according to an embodiment of the present disclosure.

Next, referring to FIG. 5, trench insulator layer 34 is etched to expose a portion of semiconductor fin 31, for example, such that the exposed portion of the semiconductor fin reaches a desired target height. Etching the trench insulator layer also removes a portion of liner insulator layer 33. After the etching step, a trench isolation portion is formed around semiconductor fin 31. The trench isolation portion includes a trench 36 surrounding the semiconductor fin and a portion of trench insulator layer 34 partially filling trench 36. The trench isolation portion may be a shallow trench isolation (STI).

Figure 6A:
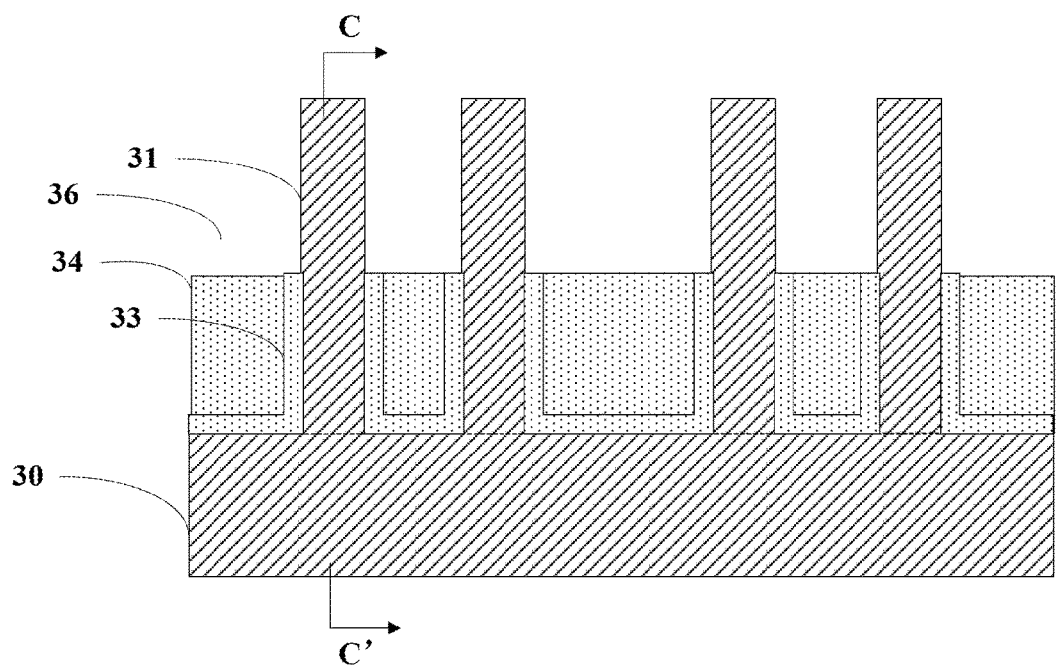
FIG. 6A is a cross-sectional view of an intermediate stage of a manufacturing method of a semiconductor device after removing the fin hardmask layer according to an embodiment of the present disclosure.
Figure 6B:
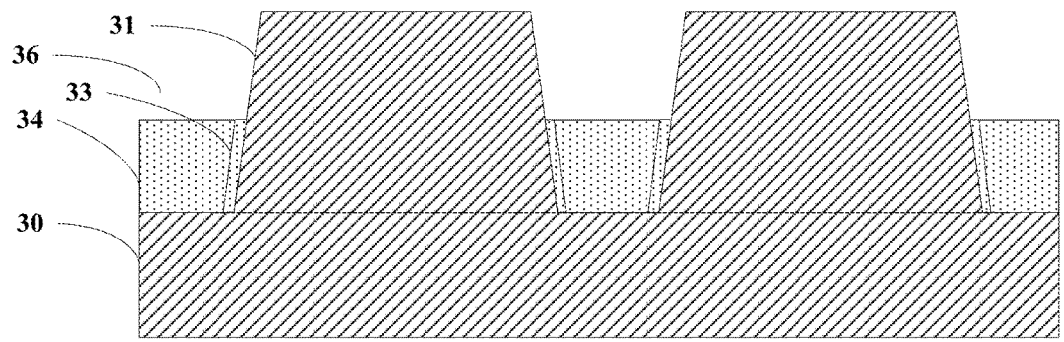
FIG. 6B is a cross-sectional view of a structure shown in FIG. 6A taken along the line C-C'.

Next, referring to FIG. 6A and FIG. 6B, fin hardmask layer 32 is removed. In one embodiment, in the case where a buffer layer is present between the semiconductor fin and the fin hardmask layer, the removal of fin hardmask layer 32 also removes the buffer layer.

Figure 7:
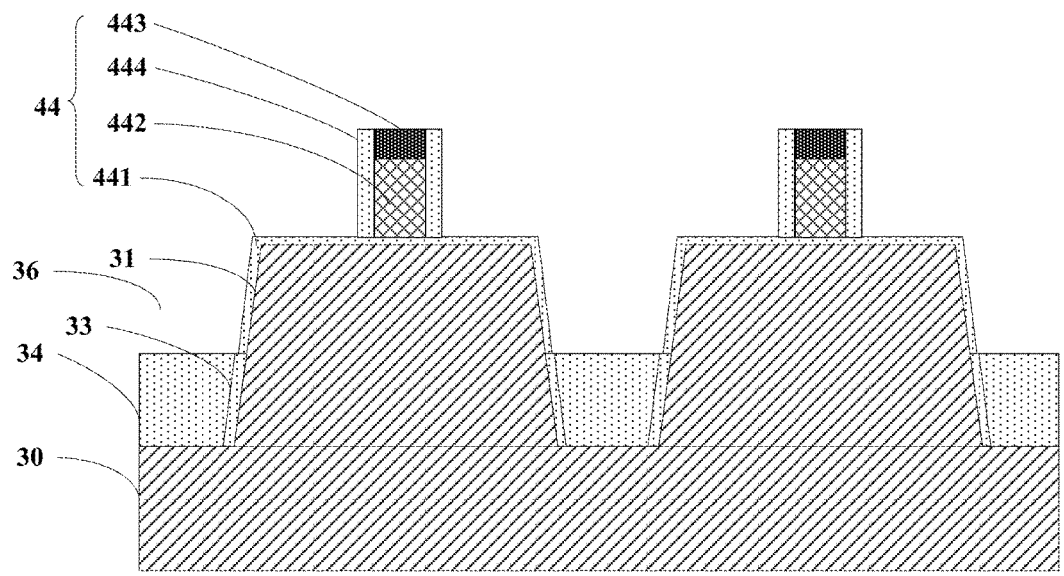
FIG. 7 is a cross-sectional view of an intermediate stage of a manufacturing method of a semiconductor device after forming a semiconductor structure according to an embodiment of the present disclosure.

Next, referring to FIG. 7, a dummy gate structure 44 is formed on semiconductor fin 31. Dummy gate structure 44 may include a dummy gate dielectric (e.g., silicon dioxide) layer 441 on semiconductor fin 31 and a dummy gate (e.g., polysilicon) 442 on dummy gate dielectric layer 441. In one embodiment, dummy gate structure 44 may also include a hardmask (e.g., silicon nitride) layer 443 on dummy gate 442. In one embodiment, dummy gate structure 44 may also include a spacer (e.g., silicon dioxide and/or silicon nitride) 444 on sidewalls of dummy gate 442.

In one exemplary embodiment, the steps of forming the dummy gate structure may include forming a dummy gate dielectric layer 441 on semiconductor fin 31 by a deposition process. In one embodiment, the steps of forming the dummy gate structure may include depositing a dummy gate material layer on dummy gate dielectric layer 441, and planarizing the dummy gate material layer. In one embodiment, the steps of forming the dummy gate structure may further include forming a patterned dummy gate hardmask layer 443 on the dummy gate material layer. In one embodiment, the steps of forming the dummy gate structure may further include etching the dummy gate material layer using dummy gate hardmask layer 443 as a mask to form a dummy gate 442. In one embodiment, the steps of forming the dummy gate structure may further include forming a spacer 444 on sidewalls of dummy gate 442.

Thus, a semiconductor structure as shown in FIG. 7 is formed. The semiconductor structure may include a substrate 30, a semiconductor fin 31, and a dummy gate structure 44 on semiconductor fin 31. In one embodiment, the semiconductor structure may also include a trench isolation portion (e.g., STI) surrounding semiconductor fin 31.

Figure 8:
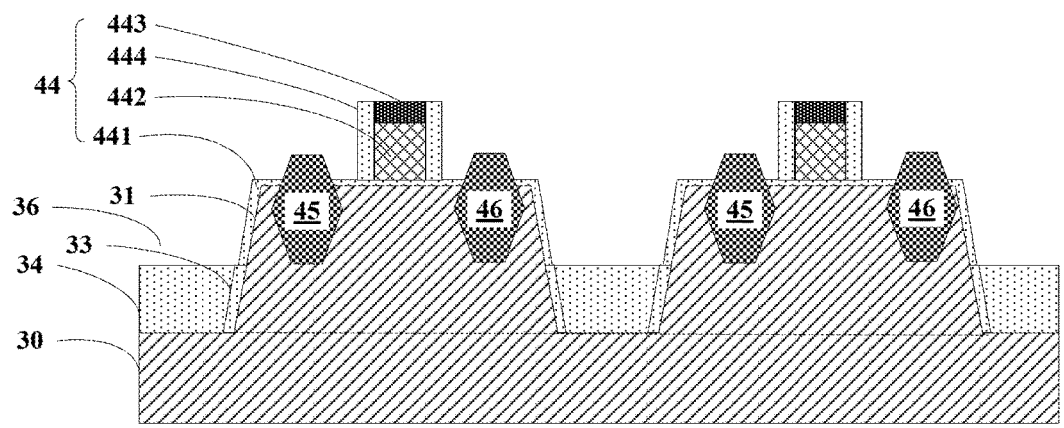
FIG. 8 is a cross-sectional view of an intermediate stage of a manufacturing method of a semiconductor device after forming a source and drain according to an embodiment of the present disclosure.

Next, referring to FIG. 8, a source 45 and a drain 46 are formed at least partially in semiconductor fin 31 on opposite sides of dummy gate structure 44. For example, a recess may be formed by etching a portion of the semiconductor fin on opposite sides of the dummy gate structure, and then the source and the drain may be formed in the recess by an epitaxial growth process. In one embodiment, the source and the drain may be doped in-situ during the formation of the source and the drain. For example, for an NMOS device, a phosphorous containing in-situ doping process may be performed. For a PMOS device, a boron containing in-situ process may be performed.

Figure 9:
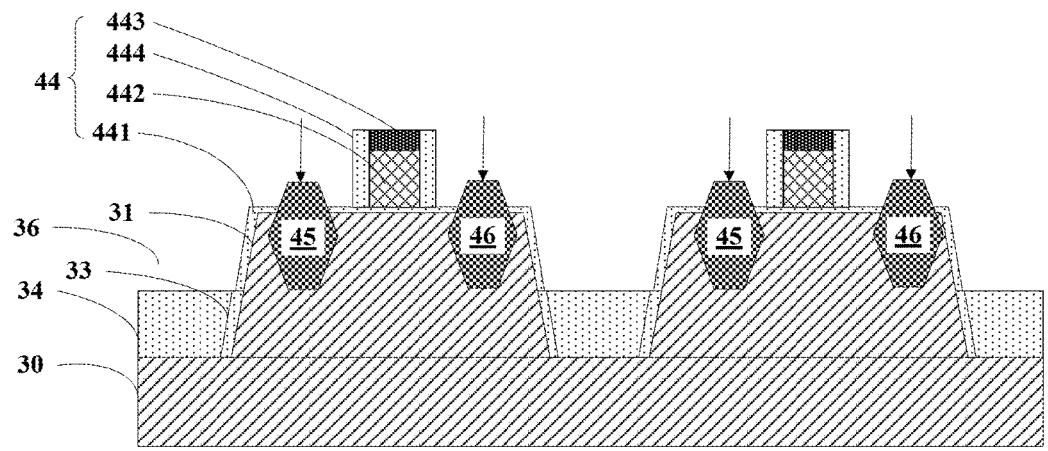
FIG. 9 is a cross-sectional view of an intermediate stage of a manufacturing method of a semiconductor device after performing a doping implant according to an embodiment of the present disclosure.

Next, referring to FIG. 9, a doping implant process, e.g., an ion implantation process, (referred to as a second doping implant) is performed into source 45 and drain 46 to increase the doping concentration of source 45 and drain 46. The second ion implantation will reduce the contact resistance when subsequent source and drain contacts are formed.

Figure 10A:
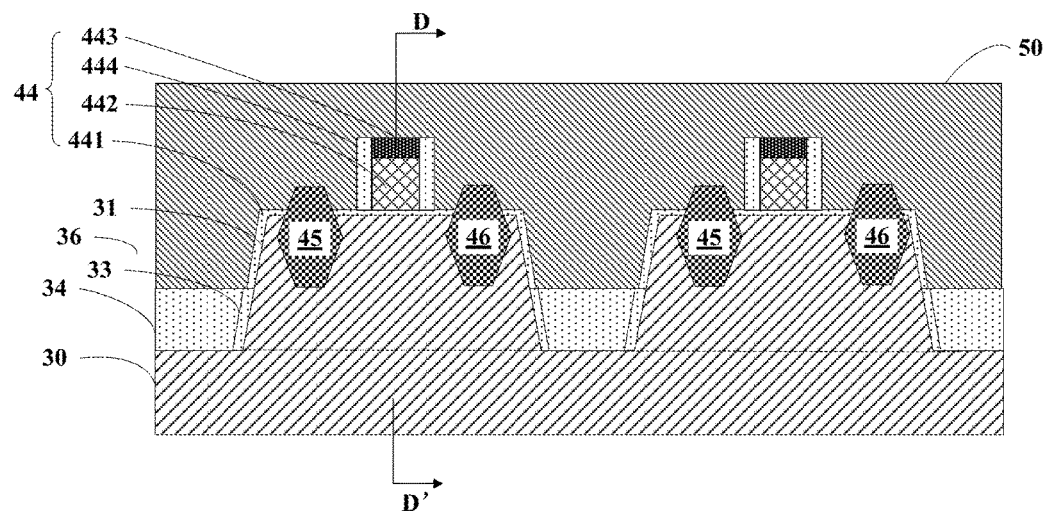
FIG. 10A is a cross-sectional view of an intermediate stage of a manufacturing method of a semiconductor device after forming an interlayer dielectric layer according to an embodiment of the present disclosure.
Figure 10B:
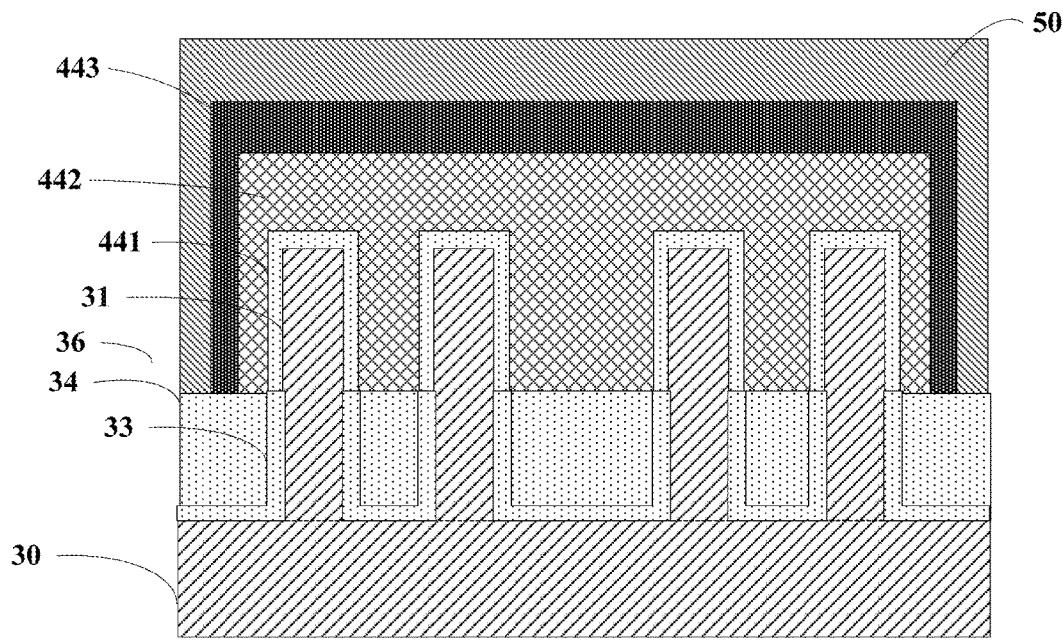
FIG. 10B is a cross-sectional view illustrating a structure shown in FIG. 10A taken along the line D-D'.

Next, referring to FIG. 10A and FIG. 10B, an interlayer dielectric layer (e.g., silicon dioxide) 50 is formed, e.g., by a deposition process on the semiconductor structure shown in FIG. 9. For example, interlayer dielectric layer 50 is formed on the trench isolation portion.

Figure 11A:
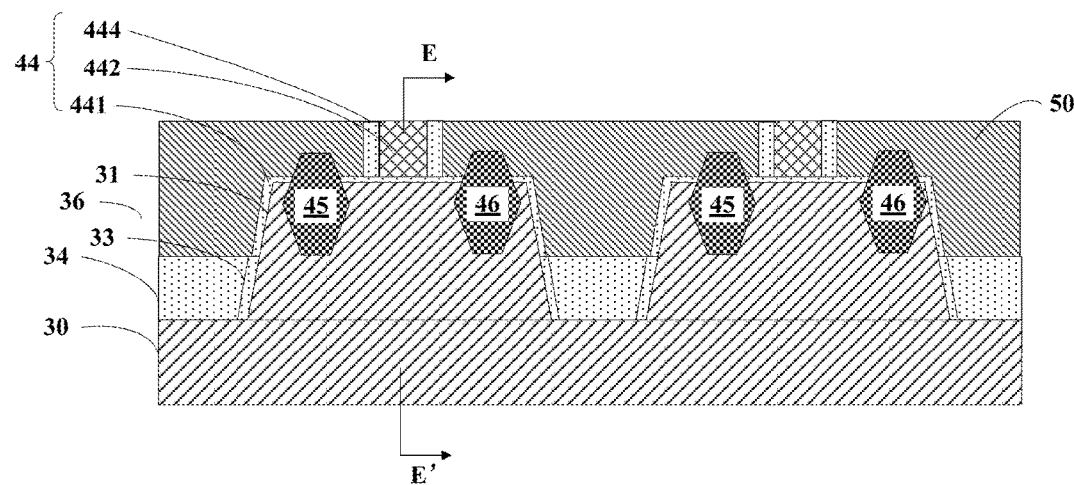
FIG. 11A is a cross-sectional view of an intermediate stage of a manufacturing method of a semiconductor device after planarizing the interlayer dielectric layer according to an embodiment of the present disclosure.
Figure 11B:
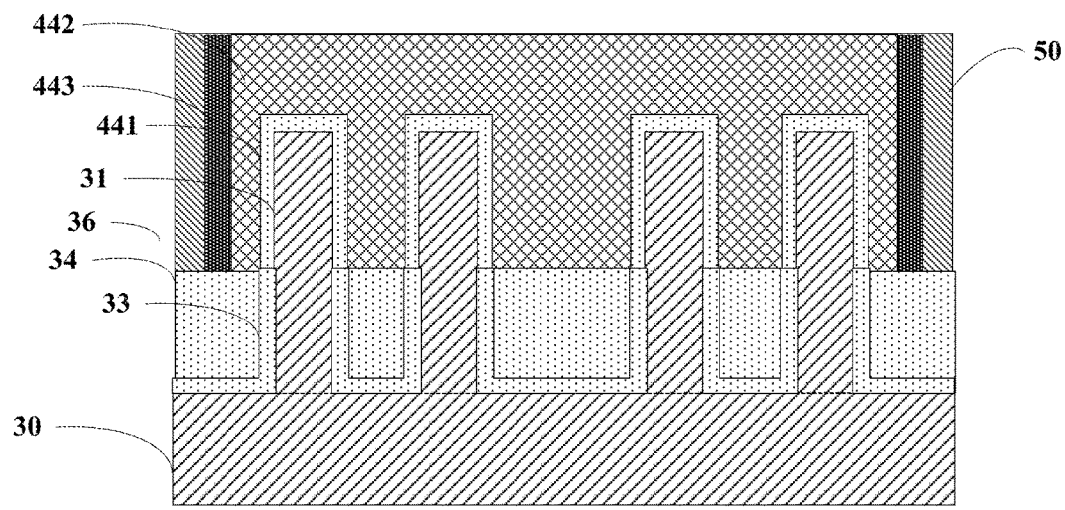
FIG. 11B is a cross-sectional view illustrating a structure shown in FIG. 11A taken along the line E-E'.

Next, referring to FIG. 11A and FIG. 11B, a planarization (e.g., chemical mechanical polishing) process is performed on interlayer dielectric layer 50 to expose an upper surface of dummy gate 442. For example, in this planarization process, a portion of interlayer dielectric layer 50 and at least a portion of dummy gate hardmask layer 443 are removed to expose an upper surface of dummy gate 442.

Figure 12:
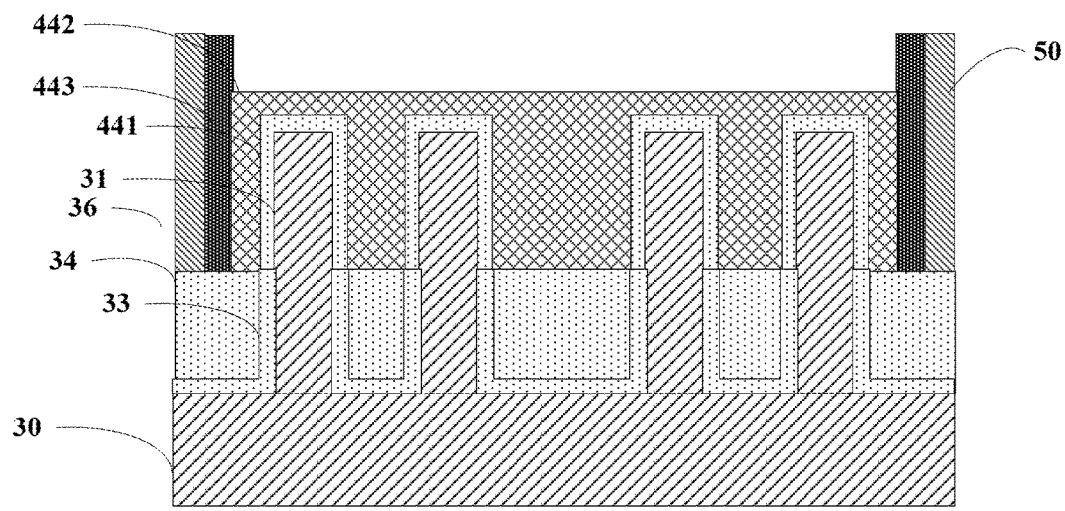
FIG. 12 is a cross-sectional view of an intermediate stage of a manufacturing method of a semiconductor device after thinning the dummy gate according to an embodiment of the present disclosure.

Next, referring to FIG. 12, a thinning process is performed on dummy gate 442. For example, a portion of the dummy gate is removed by a dry etching process to thin the dummy gate. By this thinning process, a subsequent first doping implant may require a reduced energy (the ion implantation energy) to perform the doping implant process.

Figure 13:
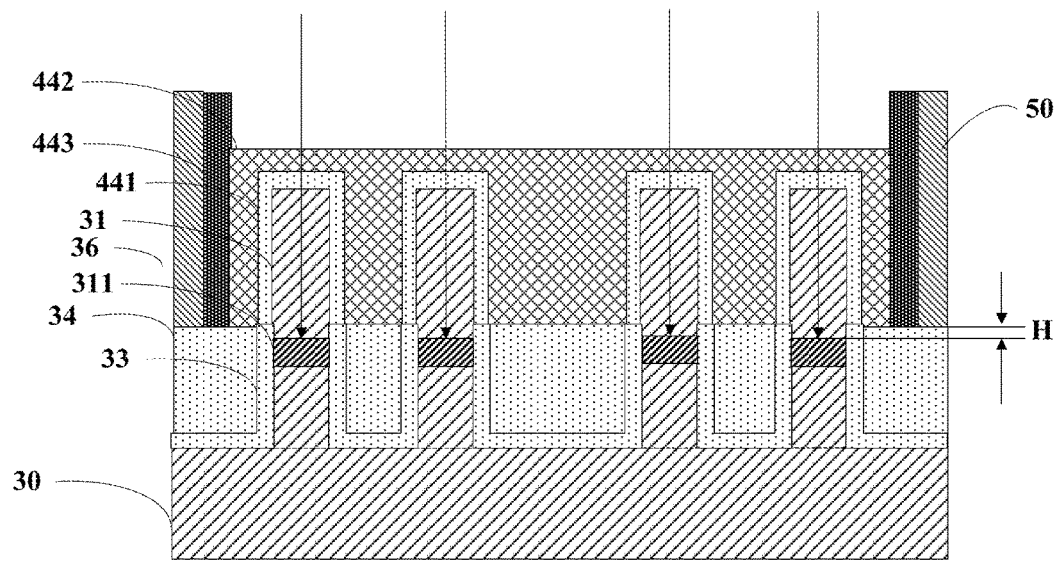
FIG. 13 is a cross-sectional view of an intermediate stage of a manufacturing method of a semiconductor device after performing a first doping implant according to an embodiment of the present disclosure.
Figure 14:
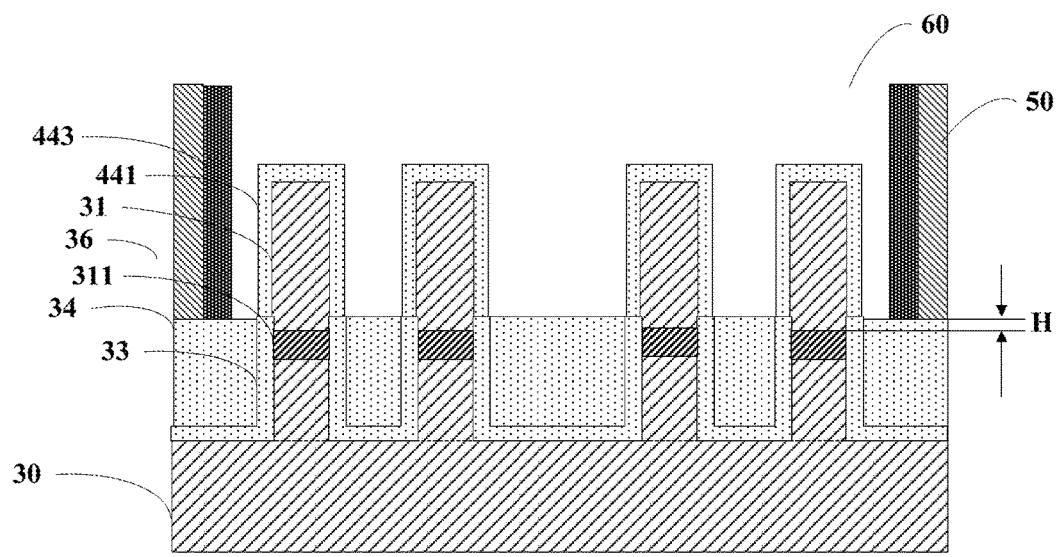
FIG. 14 is a cross-sectional view of an intermediate stage of a manufacturing method of a semiconductor device after removing the dummy gate according to an embodiment of the present disclosure.

Next, referring to FIG. 13, an implantation of a first dopant (e.g., an ion implantation) is performed on semiconductor fin 31 through dummy gate 442 to form an anti-puncture region 311 in semiconductor fin 31. The first dopant cannot pass through interlayer dielectric layer 50 to enter into the source or drain region, so that an anti-puncture region is not formed below the source and the drain.

In one embodiment, the semiconductor fin may have P-type conductivity. The dopant of the ion implantation process is a P-type dopant (e.g., B or $BF_2$). The ion implantation process can be performed at an energy in the range between 16 keV and 50 keV (e.g., 20 keV or 30 keV), the implant dose in the range between $1.0 \times 10^{13}$ atoms/cm$^2$ and $5.0 \times 10^{14}$ atoms/cm$^2$ (e.g., $5.0 \times 10^{13}$ atoms/cm$^2$ or $1.0 \times 10^{14}$ atoms/cm$^2$).

In another embodiment, the semiconductor fin may have N-type conductivity. The dopant of the ion implantation process is an N-type dopant (e.g., As or P). The ion implantation process is performed at an energy in the range between 110 keV and 200 keV (e.g., 130 keV or 160 keV), the implant dose in the range between $1.0 \times 10^{13}$ atoms/cm$^2$ and $3.0 \times 10^{14}$ atoms/cm$^2$ (e.g., $5.0 \times 10^{14}$ atoms/cm$^2$ or $2.0 \times 10^{14}$ atoms/cm$^2$).

In one embodiment, referring to FIG. 13, anti-puncture region 311 has an upper surface that is lower than the upper surface of the trench isolation portion (e.g., trench insulator layer 34 of the trench isolation region). For example, a vertical distance H of the upper surface of anti-puncture region 311 to the upper surface of the trench isolation portion (e.g., trench insulator layer 34) may be in the range between 100 angstroms and 300 angstroms (e.g., 200 angstroms).

Next, after performing the first doping implant, the manufacturing method may further include performing an annealing process on the semiconductor structure. The annealing process may activate the first doped dopant. In one embodiment, the annealing process may include spike annealing or laser annealing. For example, the spike annealing process may be performed at a temperature in the range between 850° C. and 1000° C. (e.g., the spike annealing process has a temperature of 900° C.). For example, the laser annealing process may be performed at a temperature in the range between 1000° C. and 1200° C. (e.g., the laser annealing process has a temperature of 1100° C.).

Figure 15:
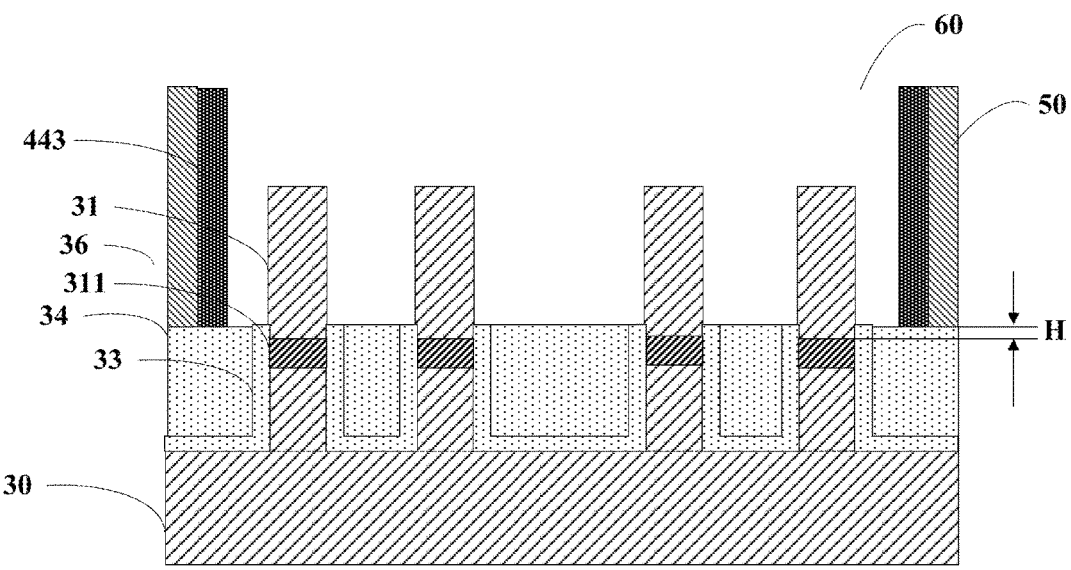
FIG. 15 is a cross-sectional view of an intermediate stage of a manufacturing method of a semiconductor device after removing the dummy gate dielectric layer according to an embodiment of the present disclosure.

Next, dummy gate 442 and dummy gate dielectric layer 441 are removed to expose a portion of semiconductor fin 31. For example, referring to FIG. 14, dummy gate 442 is removed to form trench 60. Thereafter, dummy gate dielectric layer 441 is removed to expose a portion of semiconductor fin 31, as shown in FIG. 15.

Figure 16A:
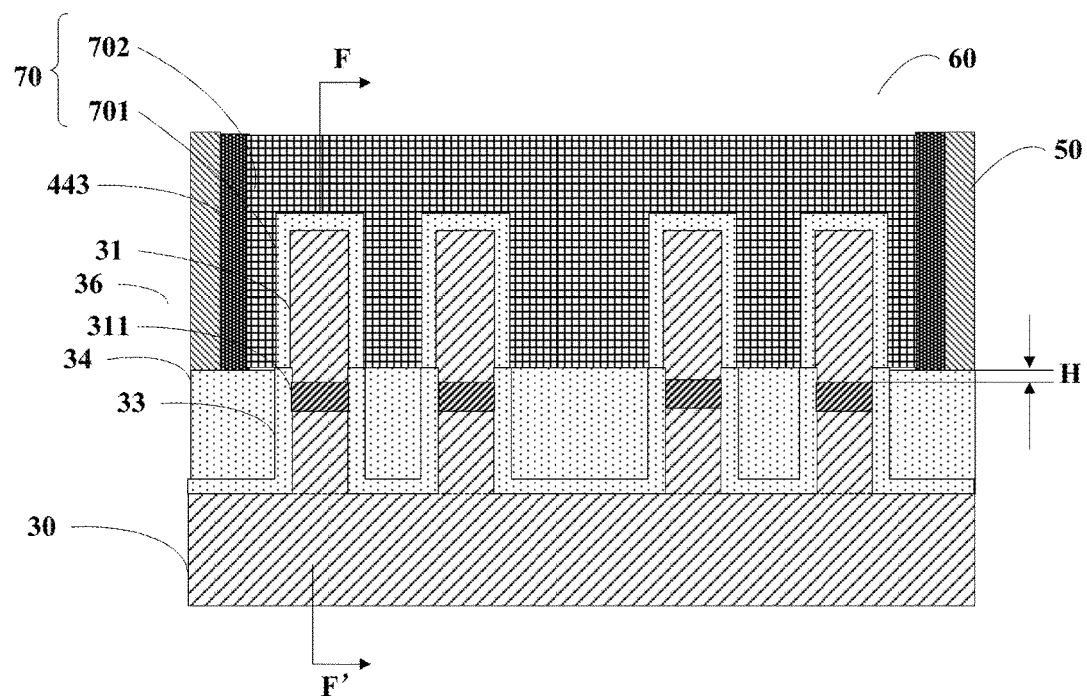
FIG. 16A is a cross-sectional view of an intermediate stage of a manufacturing method of a semiconductor device after forming a gate structure according to an embodiment of the present disclosure.
Figure 16B:
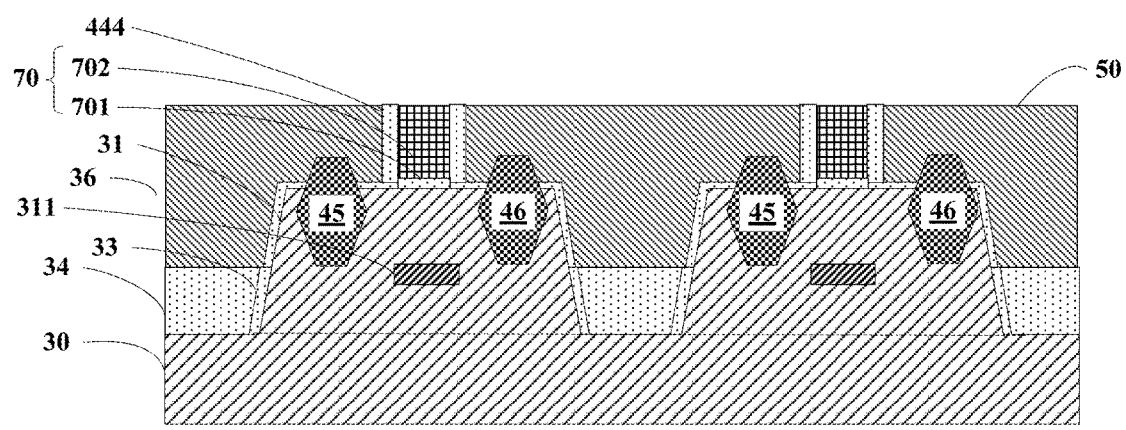
FIG. 16B is a cross-sectional view illustrating a structure shown in FIG. 11A taken along the line F-F'.

Next, referring to FIG. 16A and FIG. 16B, a gate structure 70 is formed on the exposed portion of semiconductor fin 31. Gate structure 70 is formed in trench 60. Gate structure 70 may include a gate dielectric layer (e.g., a silicon dioxide or a high dielectric constant material) 701 on semiconductor fin 31 and a gate 702 on gate dielectric layer 701. In one embodiment, gate 702 may include polysilicon or a metal such as tungsten.

Thus, a method of manufacturing a semiconductor according to an embodiment of the present disclosure has been provided. By this manufacturing method, the anti-puncture region can be formed between the source and the drain (below the channel region) and spaced apart from the source and the drain, thereby preventing a punch through of the source and the drain, reducing the leakage current and parasitic capacitance, and improving the device performance.

Embodiments of the present disclosure also provide a semiconductor device. Referring to FIG. 16A and FIG. 16B, the semiconductor device may include a substrate 30 and a semiconductor fin 31 on substrate 30. Semiconductor fin 31 includes an anti-puncture region 311. The semiconductor device may also include a gate structure 70 on semiconductor fin 31. Anti-puncture region 311 is disposed below gate structure 70. In one exemplary embodiment, gate structure 70 may include a gate dielectric layer 701 on semiconductor fin 31 and a gate 702 on gate dielectric layer 701. The semiconductor device may also include an interlayer dielectric layer 50 on substrate 30 and surrounding gate structure 70. The semiconductor device may also include a source 45 and a drain 46 at least partially in semiconductor fin 31 and on opposite sides of gate structure 70. Anti-puncture region 311 is disposed between source 45 and drain 46 and spaced apart from source 45 and drain 46.

In the semiconductor device, the anti-puncture region is disposed between the source and the drain, spaced apart from the source and the drain, and below a channel region. Thus, the anti-puncture region is not disposed below the source or the drain and is not in contact with the source and the drain, so that it can prevent a punch through of the source and the drain, thereby reducing the leakage current and parasitic capacitance and improving the device performance.

In one embodiment, referring to FIG. 16A and FIG. 16B, the semiconductor device may also include a trench isolation portion on the substrate 30 and surrounding semiconductor fin 31. The trench isolation portion may include a trench 36 surrounding the semiconductor fin and a trench insulator layer 34 partially filling trench 36. In one embodiment, anti-puncture region 311 has an upper surface that is lower than an upper surface of trench isolation portion (e.g., the upper surface of trench insulator layer 34 of the trench isolation portion). In one embodiment, the vertical distance H of the upper surface of anti-puncture region 311 to an upper surface of the trench isolation portion (e.g., the upper surface of trench insulator layer 34) is in the range between 100 angstroms and 300 angstroms (e.g., 200 angstroms).

In one embodiment, referring to FIG. 16B, the semiconductor device may further include a spacer 444 on sidewalls of the gate structure.

In one embodiment, referring to FIG. 16A and FIG. 16B, the semiconductor device may further include a liner insulator layer 33 disposed between trench insulator layer 34 and semiconductor fin 31.

Accordingly, embodiments of the present disclosure have described a semiconductor device and a method of manufacturing the same in detail. In order to avoid obscuring the description of the representative embodiments, many details known in the art are not provided herein.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a semiconductor device, comprising:
   providing a semiconductor structure including a substrate, a semiconductor fin on the substrate, and a dummy gate structure on the semiconductor fin, the dummy gate structure including a dummy gate dielectric layer on the semiconductor fin and a dummy gate on the dummy gate dielectric layer;
   forming an interlayer dielectric layer on the substrate;
   planarizing the interlayer dielectric layer to expose an upper surface of the dummy gate;
   thinning the dummy gate using an etching process; and
   performing a doping implant into the semiconductor fin through the dummy gate to form an anti-puncture region in the semiconductor fin.

2. The method of claim 1, wherein the doping implant is an ion implantation.

3. The method of claim 2, wherein the semiconductor fin has a P-type conductivity, and the ion implantation is performed with a P-type dopant, at an energy in a range between 20 keV and 70 keV, and a dose in a range between $1.0 \times 10^{13}$ atoms/cm$^2$ and $5.0 \times 10^{14}$ atoms/cm$^2$.

4. The method of claim 2, wherein the semiconductor fin has an N-type conductivity, and the ion implantation is performed with an N-type dopant, at an energy in a range between 130 keV and 250 keV, and a dose in a range between $1.0 \times 10^{13}$ atoms/cm$^2$ and $3.0 \times 10^{14}$ atoms/cm$^2$.

5. The method of claim 3, wherein the ion implantation is performed at the energy in a range between 16 keV and 50 keV, and a dose in the range between $1.0 \times 10^{13}$ atoms/cm$^2$ and $3.0 \times 10^{14}$ atoms/cm$^2$.

6. The method of claim 4, wherein the ion implantation is performed at the energy in a range between 110 keV and 200 keV.

7. The method of claim 1, further comprising, after performing the doping implant:
   performing an annealing treatment on the semiconductor structure.

8. The method of claim 7, wherein the annealing treatment comprises a spike annealing process or a laser annealing process.

9. The method of claim 8, wherein:
   the spike annealing process is performed at a temperature in a range between 850° C. and 1000° C.; or
   the laser annealing process is performed at a temperature in a range between 1000° C. and 1200° C.

10. The method of claim 1, further comprising, prior to forming the interlayer dielectric layer:
    forming a source and a drain at least partially in the semiconductor fin and on opposite sides of the dummy gate structure,
    wherein the anti-puncture region is formed between the source and the drain and spaced apart from the source and the drain.

11. The method of claim 10, further comprising, prior to forming the interlayer dielectric layer:
    performing an ion implantation process into the source and the drain to increase a doping concentration of the source and the drain.

12. The method of claim 1, wherein the substrate further comprises a trench isolation portion surrounding the semiconductor fin, wherein the anti-puncture region has an upper surface lower than an upper surface of the trench isolation portion.

13. The method of claim 12, wherein a vertical distance between the upper surface of the anti-puncture region and the upper surface of the trench isolation portion is in a range between 100 angstroms and 300 angstroms.

14. The method of claim 1, wherein the dummy gate structure further comprises a dummy gate hardmask layer on the dummy gate; and planarizing the interlayer dielectric layer comprises removing at least a portion of the interlayer dielectric layer and at least a portion of the dummy gate hardmask layer.

15. The method of claim 1, further comprising:
    removing the dummy gate and the dummy gate dielectric layer to expose a portion of the semiconductor fin; and
    forming a gate structure on the exposed portion of the semiconductor fin, wherein forming the gate structure comprises:
    forming a gate dielectric layer on the semiconductor fin; and
    forming a gate on the gate dielectric layer.

16. A semiconductor device, comprising:
    a substrate;
    a semiconductor fin having an anti-puncture region on the substrate;
    a gate structure on the semiconductor fin;
    an interlayer dielectric layer on the substrate and surrounding the gate structure;
    a trench isolation portion on the substrate and surrounding the semiconductor fin; and
    a source and a drain at least partially in the semiconductor fin and on opposite sides of the gate structure;
    wherein the anti-puncture region is disposed between the source and the drain, spaced apart from the source and the drain, and below the gate structure, and
    wherein the anti-puncture region has an upper surface lower than an upper surface of the trench isolation portion.

17. The semiconductor device of claim 16, wherein a vertical distance between the upper surface of the anti-puncture region and the upper surface of the trench isolation portion is in a range between 100 angstroms and 300 angstroms.

18. The semiconductor device of claim 16, wherein the gate structure comprises a gate dielectric layer on the semiconductor fin, and a gate on the gate dielectric layer.

* * * * *